United States Patent [19]

Gutmann

[11] Patent Number: 5,061,893

[45] Date of Patent: Oct. 29, 1991

[54] MOUNTING FOR THE ROTARY MAGNET OF A ROTARY MAGNET-RATIO METER

[75] Inventor: Franz Gutmann, Frankfurt, Fed. Rep. of Germany

[73] Assignee: VDO Adolf Schindling AG, Frankfurt am Main, Fed. Rep. of Germany

[21] Appl. No.: 539,081

[22] Filed: Jun. 14, 1990

[30] Foreign Application Priority Data

Jun. 29, 1989 [DE] Fed. Rep. of Germany ....... 3921330

[51] Int. Cl.⁵ .............................................. G01R 1/00
[52] U.S. Cl. .............................................. 324/154 PB
[58] Field of Search ........... 324/151 R, 151 A, 154 R, 324/154 PB, 155

[56] References Cited

U.S. PATENT DOCUMENTS 4,237,418 12/1980 Van Bennekom et al. ... 324/154 PB

Primary Examiner—Walter E. Snow
Attorney, Agent, or Firm—Martin A. Farber

[57] ABSTRACT

The pointer shaft 1 of a rotary-magnet ratio meter is mounted by means of radial bearings (15 and 20 respectively) one near its pointer 2 and one at the end facing its rotary magnet 4. The lower radial bearing 20 arranged near the rotary magnet 4 is formed by a blind hole 16 into which the pointer shaft 1 engages and in which it rests on a metal ball 19. This metal ball 19 therefore forms a thrust bearing 20.

5 Claims, 1 Drawing Sheet

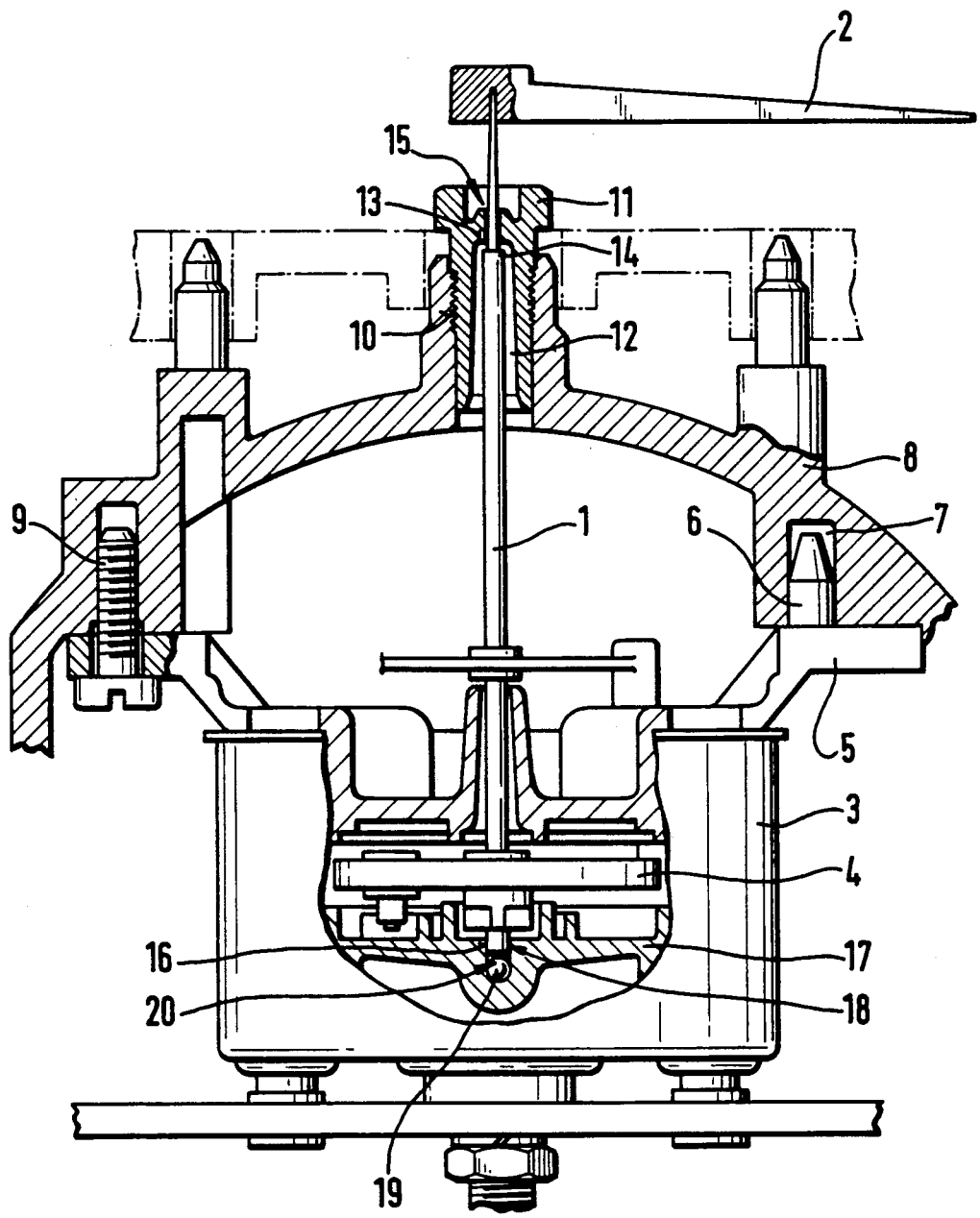

5,061,893

MOUNTING FOR THE ROTARY MAGNET OF A ROTARY MAGNET-RATIO METER

FIELD AND BACKGROUND OF THE INVENTION

The present invention relates to a rotary-magnet ratio meter having a pointer shaft which bears a rotary magnet, and wherein the pointer shaft is supported close to the pointer by means of a radial bearing, at another place by means of a further radial bearing, and, at the end opposite the pointer, by means of a thrust bearing.

Such rotary-magnet ratio meters are used for electric indicating instruments in combination with an electrical transmitter, for instance for speedometers, and are generally known.

In the case of rotary-magnet ratio meters it is necessary that the rotary magnet be supported as concentrically as possible with respect to the windings so that the greatest accuracy in measurement results. In one known rotary-magnet ratio meter, the pointer shaft is supported with two radial bearings between rotary magnet and pointer. This has the result that errors in alignment of the radial bearings have a relatively strong effect leading to inaccuracies in the measurement. The fact that the rotary magnet is not supported radially on the side facing away from the pointer, that there is therefore an overhung supporting of the rotary magnet, also contributes to this.

SUMMARY OF THE INVENTION

It is an object of the invention to develop a rotary-magnet ratio meter of the type indicated above with the simplest possible means in such a manner that errors in alignment of the two radial bearings required have the smallest possible influence on the accuracy of measurement of the rotary magnet ratio meter.

According to the invention, an additional radial bearing (18) is provided on the side of the rotary magnet (4) facing away from the pointer 2.

As a result of this development, the radial bearings are a substantially greater axial distance apart than in the known movements.

As a result, errors in alignment result in a less oblique position of the pointer shaft and thus of rotary magnet, whereby the accuracy of measurement of the rotary-magnet ratio meter is increased. At the same time, the rotary magnet is mounted more firmly since it is fixed in position on both ends by radial bearings.

Of particularly simple construction is an embodiment of the invention which the additional radial bearing (18) and the thrust bearing (20) are formed by a blind hole (16) in a structural part which is fixed to the housing and into which the lower end of the pointer shaft 1 engages, and a metal ball (19) on which the lower end surface of the pointer shaft (1) rests being inserted into the blind hole (16). The combination of a radial bearing with a thrust bearing furthermore has the result that the radial bearing is at maximum distance from the pointer. The metal ball results in a punctiform support for the pointer shaft so that the frictional forces which occur are particularly small.

It is particularly favorable from the standpoint of manufacture if the metal ball (19) is pressed into the blind hole 16.

The radial bearing (15) on the pointer side can be aligned very precisely if it is provided on a mounting bracket 8 which is detachably connected to an upper winding support part (5) of the measurement movement and if the upper winding support part (5) has two centering pins (6) which engage into corresponding centering bore holes (7) of the mounting bracket 8.

The material for the radial bearing on the pointer side can be selected independent of the material for the mounting bracket in optimal manner in accordance with the requirements of a bearing if, in accordance with another embodiment of the invention, the pointer side radial bearing (15) is arranged in a bearing screw 11 which is screwed from above into a threaded hole (10) which is coaxial to the pointer shaft (1).

The axial fixing of the pointer shaft can be effected in easily adjustable manner by providing the pointer shaft (1) in the region of the bearing screw (11) with a shoulder (14) which faces the pointer (2) and has a collar (13) opposite the bearing screw (11). Manufacturing inaccuracies can be compensated for by this bearing screw in the manner that the bearing screw is always screwed so far into the mounting pedestal that axial play is eliminated or becomes sufficiently small.

BRIEF DESCRIPTION OF THE DRAWING

The invention permits numerous embodiments. In order to further illustrate its basic principle, one embodiment is shown in the drawing and will be described below, the sole figure of the drawing showing a partial section through a rotary-magnet ratio meter in accordance with the invention.

DETAILED DESCRIPTION OF THE PREFERRED EMBODIMENT

The drawing shows a rotary magnet ratio meter having a pointer shaft 1 to which a pointer 2 is attached. The pointer shaft 1 extends into a housing 3 where a rotary magnet 4 which can rotate within coils (not shown) is provided on it. On the topside of the housing 3 there can be noted an upper winding support 5 which has two upward directed centering pins (6), one of which is shown. The centering pins 6 engage into a corresponding centering boreholes 7 in a mounting bracket 8 which is fastened on the winding support 5 by screws 9.

The mounting bracket 8 has a central threaded hole 10 into which a bearing screw 11 is screwed from above. This bearing screw 11 has a coaxial passage 12 through which the pointer shaft is conducted. The passage 12 has an inwardly directed collar 13 which is located above a shoulder 14 of the pointer shaft 1. As a result, the pointer shaft 1 cannot move axially out of the measurement movement. The diameter of the passage 12 is reduced above the collar 13 sufficiently to produce a radial bearing 15 for the pointer shaft 1 is produced.

The lower end of the pointer shaft engages into a blind hole 16 in the lower winding support 17. The blind hole 16 is so dimensioned that it forms a lower radial bearing 18 for the pointer shaft 1. A metal ball 19 is pressed into the blind hole 16, the pointer shaft 1 being seated with its lower end surface on the metal ball. In this way, a thrust bearing 20 is formed here.

I claim:
1. A rotary-magnet ratio meter comprising
   a pointer shaft, a pointer affixed to an end of the shaft, and a rotary magnet supported by the shaft;
   a first radial bearing, a second radial bearing, and a thrust bearing; and wherein said shaft is supported close to the pointer by means of said first radial bearing, at another place by means of said second radial bearing, and, at the end opposite the pointer, by means of said thrust bearing;

said second radial bearing is provided on a side of the rotary magnet facing away from the pointer;

said ratio meter further comprises a housing, and a structural part which is fixed to the housing; and wherein said second radial bearing and said thrust bearing are formed by a blind hole in said structural part for receiving the lower end of the pointer shaft, there being a metal ball in said blind hole, a lower end surface of the pointer shaft resting upon the metal ball.

2. A meter according to claim 1, wherein
the metal ball is pressed into the blind hole.

3. A meter according to claim 1, wherein
said shaft constitutes part of a measurement movement; and said meter further comprises an upper winding support part of the measurement movement;

a mounting bracket which is detachably connected to the upper winding support part;

centering bore holes in the mounting bracket; and two centering pins located in the upper winding part for engagement into corresponding centering bore holes of the mounting bracket; and wherein said first radial bearing is held by said mounting bracket.

4. A meter according to claim 3, further comprising
a bearing screw, and threaded hole which is coaxial to the pointer shaft; and wherein the bearing screw is screwed from above into the threaded hole; and said first radial bearing is arranged in said bearing screw.

5. A meter according to claim 4, wherein
the pointer shaft in the region of the bearing screw has a shoulder which faces the pointer, there being a collar on said mounting bracket opposite said bearing bolt.

* * * * *